US009130001B2

(12) United States Patent
Koelmel et al.

(10) Patent No.: US 9,130,001 B2
(45) Date of Patent: *Sep. 8, 2015

(54) EDGE RING FOR A THERMAL PROCESSING CHAMBER

(71) Applicant: Applied Materials, Inc., Santa Clara, CA (US)

(72) Inventors: Blake Koelmel, Mountain View, CA (US); Joseph M. Ranish, San Jose, CA (US); Abhilash J. Mayur, Salinas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/287,782

(22) Filed: May 27, 2014

(65) Prior Publication Data

US 2014/0270736 A1  Sep. 18, 2014

Related U.S. Application Data

(63) Continuation of application No. 13/402,106, filed on Feb. 22, 2012, now Pat. No. 8,755,680.

(60) Provisional application No. 61/446,026, filed on Feb. 23, 2011.

(51) Int. Cl.
*F27B 5/00* (2006.01)
*F27B 5/06* (2006.01)
*F27D 5/00* (2006.01)
*H01L 21/673* (2006.01)
*F27D 11/12* (2006.01)
(Continued)

(52) U.S. Cl.
CPC ........ *H01L 21/67346* (2013.01); *F27D 5/0037* (2013.01); *F27D 11/12* (2013.01); *H01L 21/67115* (2013.01); *H01L 21/68735* (2013.01); *F27D 2005/0081* (2013.01)

(58) Field of Classification Search
CPC ............... H01L 21/68735; H01L 21/6734; F27D 11/12; F27D 5/0037
See application file for complete search history.

(56) References Cited

U.S. PATENT DOCUMENTS

| 5,938,850 A | 8/1999 | Arami et al. |
| 6,200,388 B1 | 3/2001 | Jennings |
| 6,200,634 B1 | 3/2001 | Johnsgard et al. |

(Continued)

FOREIGN PATENT DOCUMENTS

| JP | 2004-289003 A | 10/2004 |
| WO | 2007/131547 A1 | 11/2007 |
| WO | 2010/030529 A2 | 3/2010 |

OTHER PUBLICATIONS

International Search Report for International Application PCT/US2011/046008; 10 pages; Mar. 8, 2012.

(Continued)

*Primary Examiner* — Joseph M Pelham
(74) *Attorney, Agent, or Firm* — Patterson & Sheridan, LLP

(57) ABSTRACT

Embodiments of the present invention provide an edge ring for supporting a substrate with increased temperature uniformity. More particularly, embodiments of the present invention provide an edge ring having one or more fins formed on an energy receiving surface of the edge ring. The fins may have at least one sloped side relative to a main body of the edge ring.

18 Claims, 10 Drawing Sheets

(51) Int. Cl.
*H01L 21/687* (2006.01)
*H01L 21/67* (2006.01)

(56) References Cited

U.S. PATENT DOCUMENTS

| | | | |
|---|---|---|---|
| 6,264,467 B1 | 7/2001 | Lue et al. | |
| 6,280,183 B1 | 8/2001 | Mayur et al. | |
| 6,395,363 B1 | 5/2002 | Ballance et al. | |
| 6,888,104 B1 | 5/2005 | Ranish et al. | |
| 7,127,367 B2 | 10/2006 | Ramachandran et al. | |
| 7,378,618 B1 | 5/2008 | Sorabji et al. | |
| 7,860,379 B2 | 12/2010 | Hunter et al. | |
| 8,221,602 B2 | 7/2012 | Brown et al. | |
| 8,287,650 B2 * | 10/2012 | Lee et al. | 118/728 |
| 2003/0183611 A1 * | 10/2003 | Gregor et al. | 219/390 |
| 2008/0069951 A1 | 3/2008 | Chacin et al. | |
| 2008/0092818 A1 | 4/2008 | Fink et al. | |
| 2008/0141942 A1 * | 6/2008 | Brown et al. | 118/723 R |
| 2008/0142497 A1 | 6/2008 | Sorabji et al. | |
| 2008/0169282 A1 | 7/2008 | Sorabji et al. | |
| 2009/0298300 A1 | 12/2009 | Ranish et al. | |
| 2010/0243608 A1 | 9/2010 | Koshimizu | |
| 2012/0042825 A1 * | 2/2012 | Hawrylchak | 118/504 |
| 2013/0058636 A1 | 3/2013 | Koelmel et al. | |
| 2013/0203269 A1 * | 8/2013 | Yokouchi | 438/795 |

OTHER PUBLICATIONS

International Search Report for International Application PCT/US2012/025818; 9 pages; Dec. 3, 2012.
WO 2007/131547 A1; Baumann, et al.; Alternate Abstract; Machine Translation.

* cited by examiner

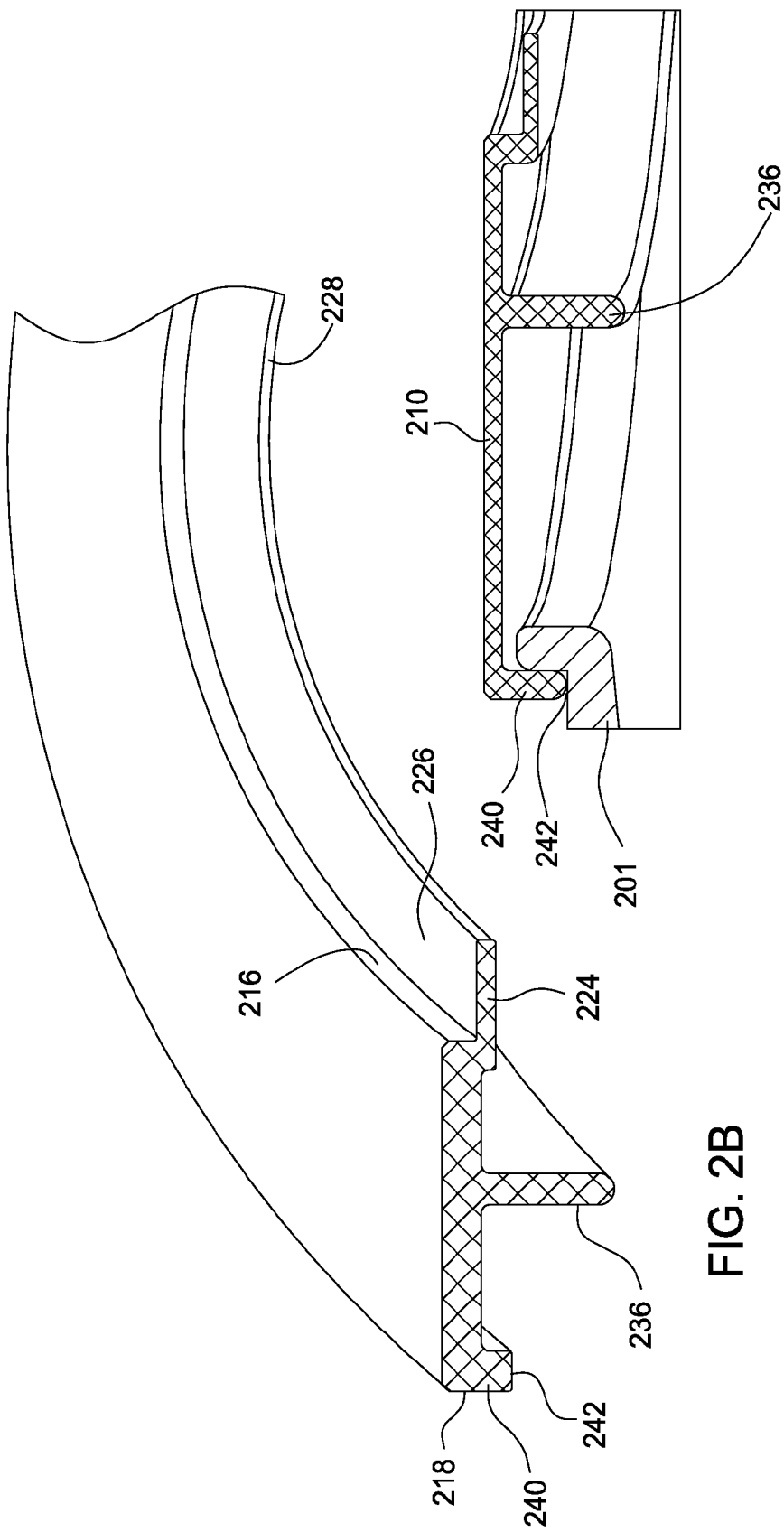

EDGE RING FOR A THERMAL PROCESSING CHAMBER

CROSS-REFERENCE TO RELATED APPLICATIONS

This application is a continuing application of the co-pending U.S. patent application Ser. No. 13/402,106, filed Feb. 22, 2012, which claims benefit of U.S. Provisional Application Ser. No. 61/446,026, iled Feb. 23, 2011. Each of the aforementioned patent applications are incorporated herein by reference.

BACKGROUND

1. Field

Embodiment of the present invention generally relates to a method and apparatus for fabricating devices on a substrate. More particularly, embodiments of the present invention provide a substrate supporting ring to support a substrate around the edge region in a processing chamber.

2. Description of the Related Art

In the processing of substrates, such as semiconducting wafers and display panels, a substrate is placed on a support in a process chamber while suitable processing conditions are maintained in the process chamber. For example, a substrate can be heated in a controlled heating cycle to be thermally processed. During a thermal process, a substrate may be supported by a supporting structure, such as an edge ring, around the edge region while radiant energy source disposed above or below the substrate projects thermal energy towards the substrate.

FIG. 1A schematically illustrates a sectional view of a traditional edge ring 101 used in a thermal processing chamber. The edge ring 101 has an inner diameter slightly smaller than an outer diameter of a substrate 102 being processed. During processing, the substrate 102 is disposed on a supporting surface 105 of the edge ring 101 so that the edge ring 101 contacts and supports the substrate 102 by an outer edge region 104. Thermal energy 103 may be directed to the substrate 102 below the substrate 102 and the edge ring 101 to heat the substrate 102.

However, the traditional edge ring 101 as shown in FIG. 1A sometimes cause the temperature non-uniformity around the outer edge region 104 on the substrate 102. The temperature non-uniformity becomes more pronounced when the substrate 102 is heated at a rapid rate. FIG. 1B schematically illustrates temperature variations around the outer edge region 104 of a substrate during heating. In FIG. 1B, the x-axis indicates azimuthally locations in an outer edge of a substrate denoted by 0 to 360 degrees. The y-axis indicates a temperature variation from an average temperature in Celsius degrees. Each curve 110, 111 represents a measurement of a substrate during rapid heating. As shown in FIG. 1B, the temperature variation around the edge region of a substrate can be up to 8 degrees Celsius.

Therefore, there is a need for an improved substrate support for supporting a substrate around the edge region in a processing chamber.

SUMMARY

Embodiments of the present invention generally provide apparatus and methods for processing a substrate. More particularly, embodiments of the present invention provide an edge ring for supporting a substrate in a processing chamber.

One embodiment of the present invention provides an edge ring for supporting a substrate in a processing chamber. The edge ring includes a ring shaped body defined by an inner edge, an outer edge, an upper side and a lower side, wherein the inner edge and outer edge are concentric about a central axis. The edge ring also includes a lip extending radially inward from the inner edge of the ring shaped body. At least a portion of an upper surface of the lip is configured to support a substrate around an outer edge of the substrate so that the substrate is substantially parallel to a major plane that is perpendicular to the central axis. The edge ring also includes a fin formed on at least one of the upper side or lower side of the ring shaped body, wherein the fin has at least one sloped side relative to the ring shaped body.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2B is a partial sectional perspective view of the edge ring of FIG. 2A.

FIG. 2C is a partial sectional perspective view showing a bottom side of the edge ring of FIG. 2A.

To facilitate understanding, identical reference numerals have been used, where possible, to designate identical elements that are common to the figures. It is contemplated that elements disclosed in one embodiment may be beneficially utilized on other embodiments without specific recitation

DETAILED DESCRIPTION

Embodiments of the present invention provide apparatus and methods for fabricating devices on a substrate. More particularly, embodiments of the present invention provide an edge ring for supporting a substrate during thermal processing with improved temperature uniformity.

Embodiments of the present invention provide an edge ring for supporting a substrate with increased temperature uniformity. More particularly, embodiments of the present invention provide an edge ring having one or more surface area increasing structures formed on an energy receiving surface of the edge ring. The surface area increasing structure increases the ratio of exposed surface area and mass in the edge ring, thus, reducing radial temperature gradient during heating. The surface area increasing structures may include a fin extending vertically from a planar ring body. According to one embodiment of the present invention, the fin may have at least one sloped side. The added mass of the surface area increasing structure also improves azimuthal thermal conductivity of the edge ring. Therefore, the edge ring according to embodiments of the present invention reduces azimuthal and radial deformation of the edge ring and improve uniformity of thermal exchange between the edge ring and the substrate, thus improves processing uniformity.

Embodiments of the present invention also provide an edge having a chamber contacting surface located on a plane close to a plane including the center of gravity of the edge ring. But positioning the chamber contacting surface at a level close to the center of gravity, the edge ring is supported at a level close to the center of gravity, thus reducing and controlling the deformation of the edge ring during processing.

Figure 2A:
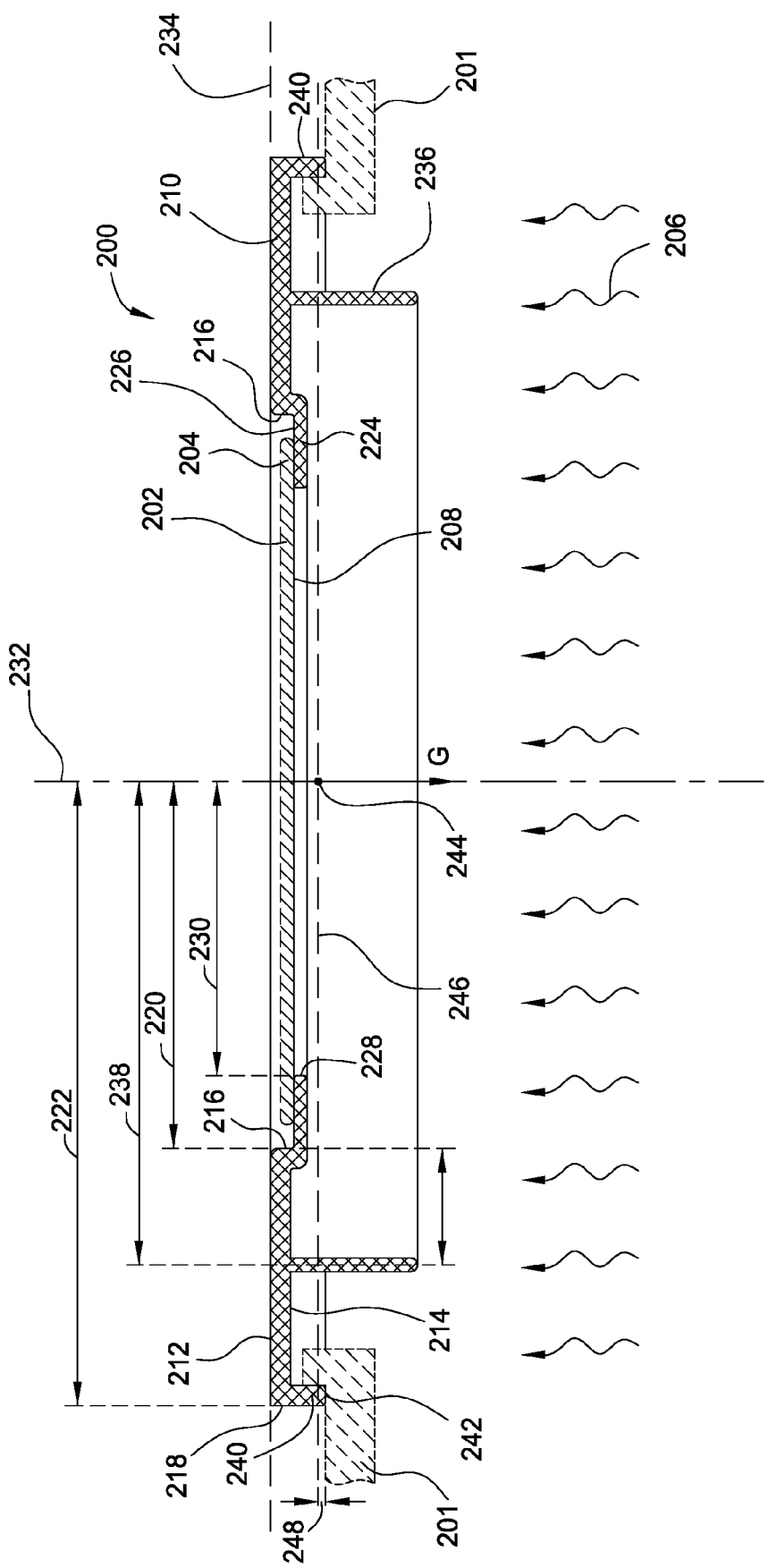
FIG. 2A is a sectional view of an edge ring according to one embodiment of the present invention.

FIG. 2A is a sectional view of an edge ring 200 according to one embodiment of the present invention. The edge ring 200 is configured to support a substrate 202 during processing in a chamber. Generally, the edge ring 200 is disposed on a chamber component, such as a ring support 201, and is configured to contact the substrate 202 by an edge region 204 and allow the majority of the substrate 202 exposed to radiant energy 206.

The edge ring 200 includes a ring shaped body 210. The ring shaped body 210 is defined by an upper surface 212, a lower surface 214, an inner edge 216 and an outer edge 218. The inner edge 216 and the outer edge 218 may be concentric circles about a central axis 232. The inner edge 216 may have an inner radius 220 and the outer edge 218 has an outer radius 222. In one embodiment, the ring shaped body 210 may be planar and have a major plane 234 perpendicular to the central axis 232.

A lip 224 extends radially inward from the inner edge 216 of the ring shaped body 210. The lip 224 has an upper surface 226 configured to support the substrate 202 by the edge region 204. The lip 224 is configured to position the substrate 202 substantially parallel to the major plane 234. The lip 224 forms a central opening 228 concentric to the inner edge 216 with a radius 230 from the central axis 232. The central opening 228 exposes the majority of a back surface 208 of the substrate 202 to the radiant energy 206.

In one embodiment, a fin 236 may be formed on the lower surface 214. The fin 236 to reduce temperature gradient from the outer edge 218 to the inner edge 216 and the lip 224. The fin 236 increases the surface area of the lower surface 214. In one embodiment, the fin 236 is a thin wall extending vertically from the lower surface 214.

In one embodiment, the fin 236 is a continuous circular wall concentric to the outer edge 218 and the inner edge 216, and the central opening 228. The fin 236 may be positioned between the outer edge 218 and the inner edge 216. The fin 236 has a radius 238 from the central axis 232. The radius 238 of the fin 236 may be designed to achieve the radial temperature gradient or temperature profile of the edge ring 200, thus, reduce deformation of the edge ring 200 during heating. In one embodiment, the radial temperature gradient may be reduced by positioning the fin 236 towards the inner edge 216.

Being continuous, the fin 236 also increases the stiffness of the edge ring 200, and further reduces deformation along radial direction and along azimuthal direction. Being continuous, the fin 236 also increases azimuthal thermal conductivity of the edge ring 200, thus, improve uniformity and reduce deformation.

In one embodiment, the edge ring 200 includes a positioning rim 240 extending from the ring shaped body 210 near the outer edge 218. The positioning rim 240 is configured to securely mount the edge ring 200 on a chamber component, such as a supporting ring 201 shown in doted lines in FIG. 2A.

In one embodiment, a bottom surface 242 of the positioning rim 240 is configured to contact the supporting ring 201 and receive support from the processing chamber. In one embodiment, the bottom surface 242 is substantially planar and is positioned vertically in close proximity to the center of gravity 244 of the edge ring 200. As shown in FIG. 2A, a plane 246 parallel to the major plane 234 passes the center of gravity 244. The bottom surface 242, which receives supports from the chamber, is at a distance 248 from the plane 246. In one embodiment, the distance 248 is about 0.75 mm or less. The bottom surface 242 may be above or below the center of gravity 244 for less than 0.75 mm.

According to embodiment of the present invention, by positioning the edge ring supporting surface vertically close to the center of gravity 244, deformation of the edge ring, such as bucking. According to one embodiment of the present invention, the direction of edge ring bucking can be adjusted by supporting the edge ring 200 on a plane above or below the center of gravity 244.

In one embodiment, the edge ring 200 is configured to support the substrate 202 while the substrate 202 is exposed to radiant energy 206 projected towards the backside 208 of the substrate 202. Both of the edge ring 200 and the substrate 202 are heated by the radiant energy 206. The edge region 204 of the substrate 202 is shadowed from the radiant energy 206 by the lip 224 of the edge ring 200. The edge region 204 is heated by direct thermal exchange with the lip 224 of the edge ring 200.

The surface area increasing structure, such as the fin 236, increases the exposed surface of edge ring 200, thus, increasing thermal conductivity, reducing temperature gradient, and ultimately reducing deformation in the edge ring 200. The position of the supporting surface 242 which is close to the center of gravity 244, reduces bucking of the edge ring 200, thus also reduce deformation of the edge ring. Because of the reduced deformation of the edge ring 200, the lip 224 of the edge ring 200 and the edge region 204 of the substrate 202 maintains solid direct contact around the entire edge region 204, thus, achieves uniform heating in the edge region 204.

Figure 2E:
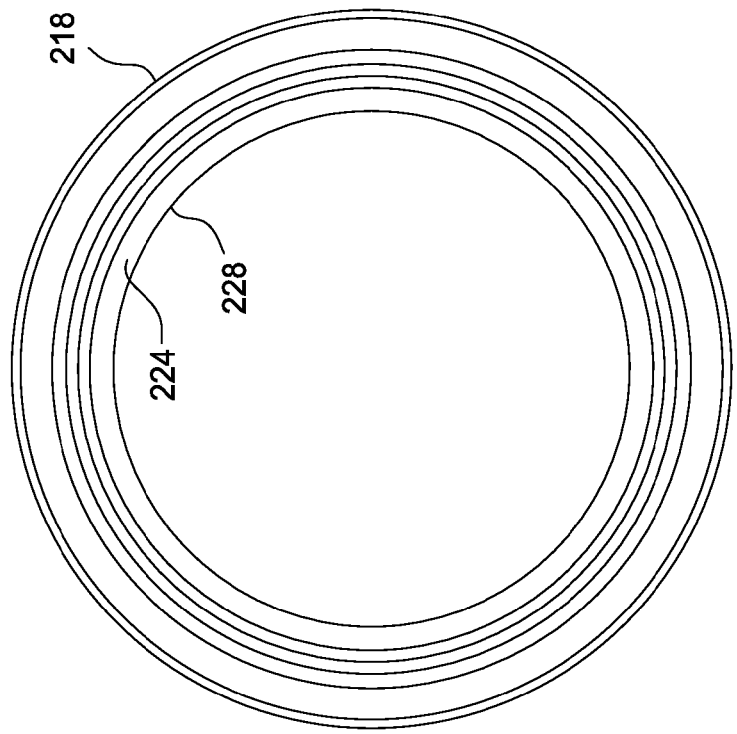
FIG. 2E is a bottom view of the edge ring of FIG. 2A.
Figure 2D:
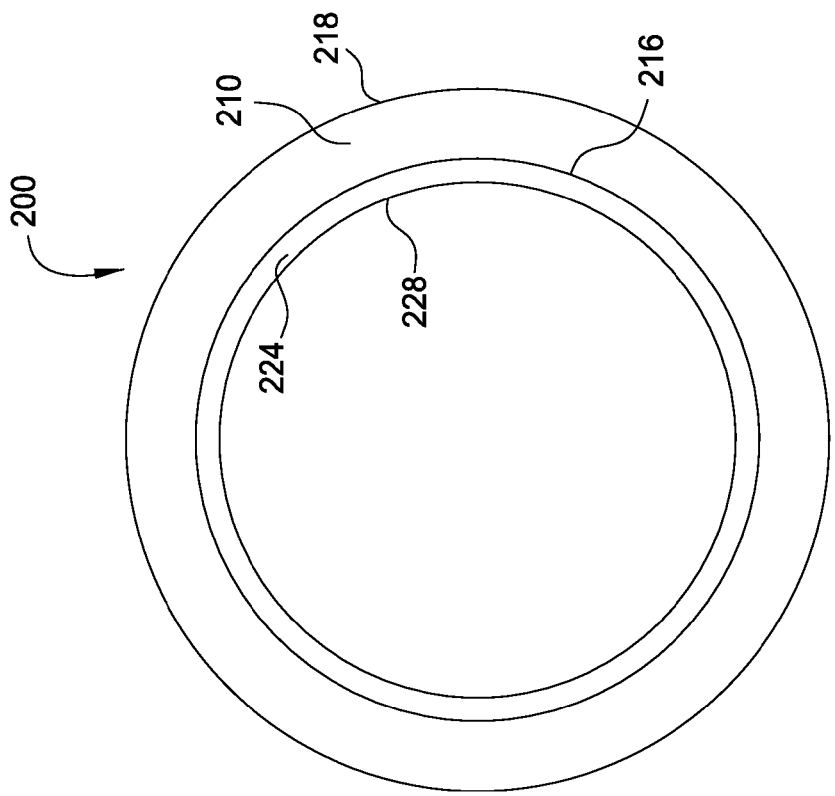
FIG. 2D is a top view of the edge ring of FIG. 2A.

FIG. 2B is a partial sectional perspective view of the edge ring 200. FIG. 2C shows the edge ring 200 being supported by the supporting ring 201 by the bottom surface 242 of the positioning rim 240. FIG. 2D is a top view of the edge ring 200. FIG. 2E is a bottom view of the edge ring 200.

The edge ring 200 may be formed from a suitable material according to the material of the substrate 202 being processed. For example, the edge ring 200 may be formed from a material having a similar thermal capacity as the material of the substrate 202. For example, the edge ring 200 may be formed from a silicon carbide material for processing a silicon substrate. The edge ring 200 may be formed by sintering a powder material then machining to dimension. Details about the material and method for forming the edge ring can be found in U.S. Pat. No. 6,888,104, U.S. Pat. No. 7,127,367, which are incorporated herein by reference.

Embodiments of the present invention provide an edge ring with surface area increasing structures formed on a surface that is configured to face a radiant energy source during a thermal processing. In one embodiment, the ratio of edge ring surface area that is exposed to a radiant energy source and the mass of the edge ring may be above about 0.55 meters squared per kilogram. In another embodiment, the ratio of exposed area and the mass may be above about 0.70 meters squared per kilogram. In another embodiment, the ratio of exposed area and the mass may be between about 0.7 to about 1.0 meters squared per kilogram.

Various factors may be considered to improve or modify the edge ring according to process requirements. Exemplary factors include but not limited to the ratio of exposed area and the mass of the edge ring, the outer diameter of the edge ring, the relative position of a supporting surface to the center of gravity, thermal conductivity along the radial direction, thermal conductivity along azimuthal direction, and stiffness of the edge ring.

FIGS. 3A-3G are partial sectional views of edge rings according to embodiments of the present invention. The edge rings shown in FIGS. 3A-3G are configured to support a substrate while the substrate being heated from a radiant energy from disposed below the substrate and the edge ring.

Figure 3A:
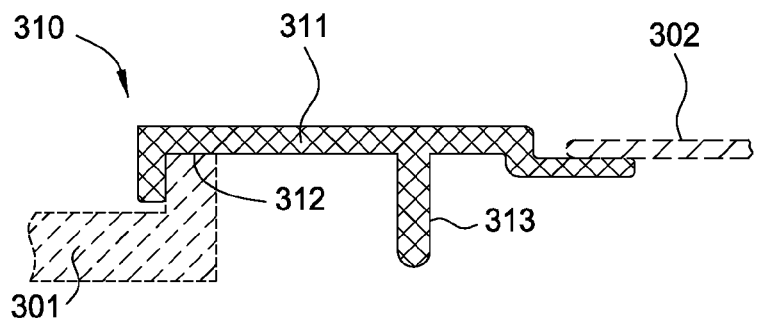
FIGS. 3A-3G schematically illustrate edge rings according to embodiments of the present invention.

FIG. 3A is a partial schematic sectional view of an edge ring 310 having a surface area increasing fin 313 and configured for supporting a substrate 302 while mounted on a supporting ring 301. The edge ring 310 is similar to the edge ring 200 except the edge ring 310 is supported by a bottom surface 312 of a ring shaped body 311.

Figure 3B:
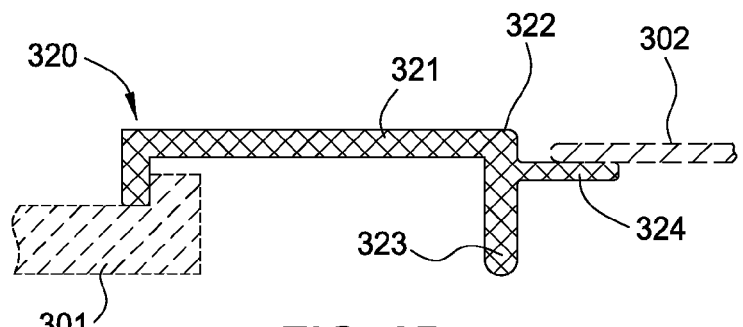

FIG. 3B is a partial schematic sectional view of an edge ring 310. The edge ring 320 is similar to the edge ring 200 except the edge ring 320 includes a fin 323 positioned at an inner edge 322 of a ring shaped body 321. A lip 324 for supporting the substrate extends from the fin 323.

Figure 3C:
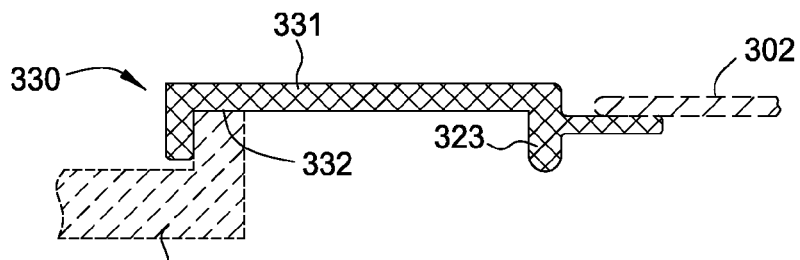

FIG. 3C is a partial schematic sectional view of an edge ring 330. The edge ring 330 is similar to the edge ring 320 except the edge ring 330 is supported by a bottom surface 332 of a ring shaped body 331.

Figure 3D:
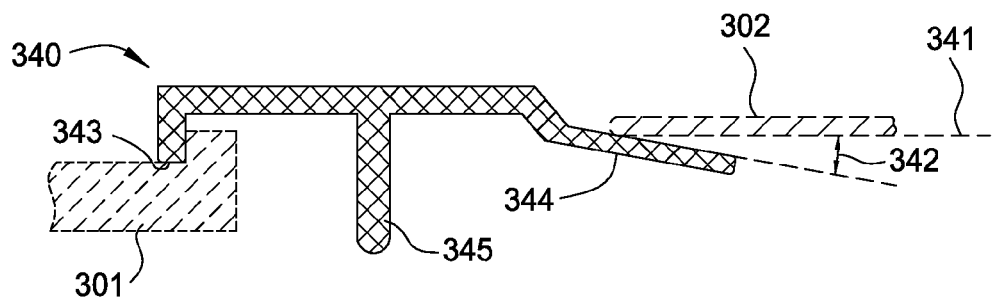

FIG. 3D is a partial schematic sectional view of an edge ring 340. The edge ring 340 having a fin 345 is similar to the edge ring 200 except the edge ring 340 includes a lip 344 that is tilted at an angle 342 from a horizontal plane 341. In one embodiment, the angle is about 10 degrees. In one embodiment, the location of supporting surface 343 may be adjusted relative to the center of gravity so that the lip 344 deforms to be substantially horizontal during processing.

Figure 3E:
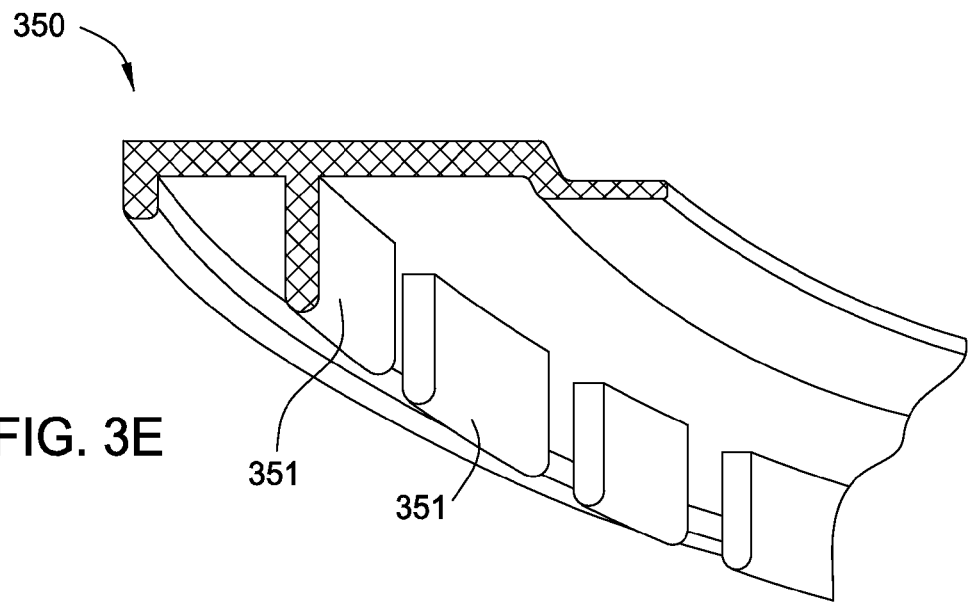

FIG. 3E is a partial perspective view of an edge ring 350. The edge ring 350 is similar to the edge ring 200 except the edge ring 350 a plurality of discrete fins 351. The discrete fins 351 further increase the exposed surface area.

Figure 3F:
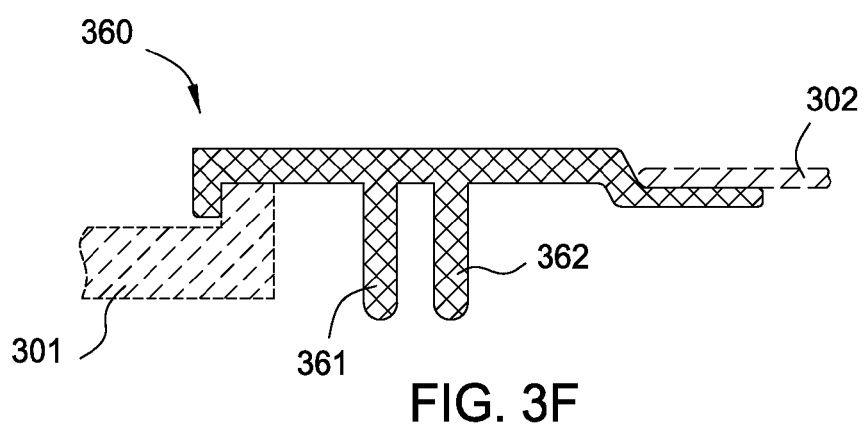

FIG. 3F is a partial schematic sectional view of an edge ring 360. The edge ring 360 is similar to the edge ring 200 except the edge ring 360 includes two fins 361, 362 concentrically arranged. The two fins 361, 362 further increases exposed surface area and stiffness of the structure.

Figure 3G:
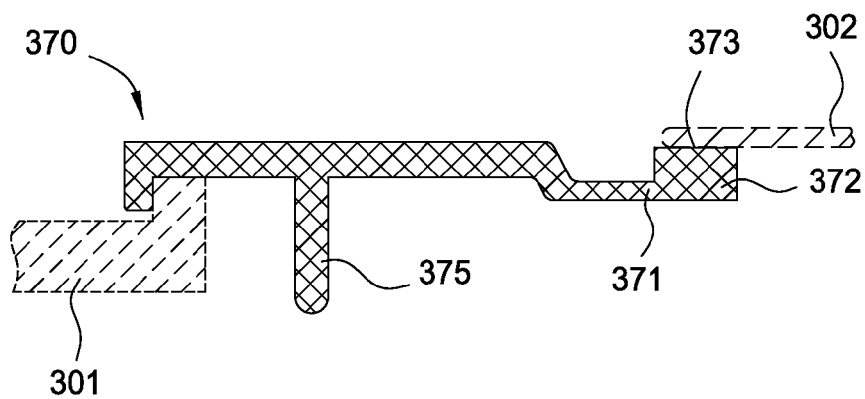

FIG. 3G is a partial schematic sectional view of an edge ring 370. The edge ring 370 including a fin 375 is similar to the edge ring 200 except the edge ring 370 includes a lip 371 having a raised portion 372. The raised portion 372 has an upper surface 373 for contacting the substrate 302. The raised portion 372 may be one continuous structure, or a plurality of discrete structures.

Even though, fins are illustrated in the above examples, surface area increasing structures may have any suitable form.

FIGS. 4A-4D schematically illustrate edge rings for having an upper energy receiving surface according to embodiments of the present invention.

Figure 4A:
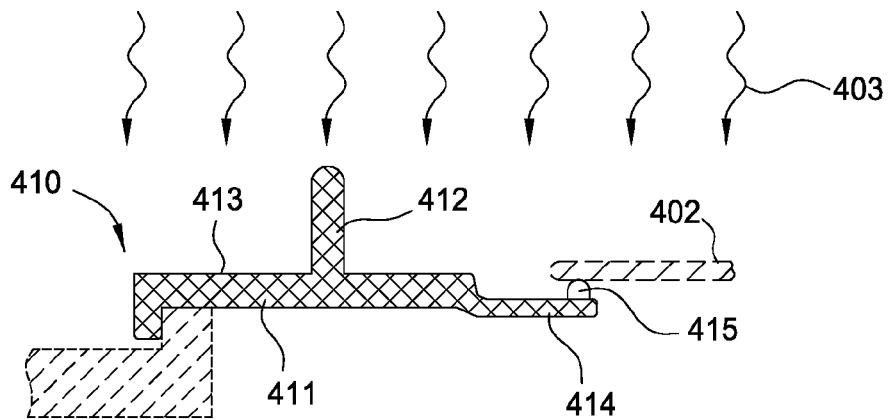
FIGS. 4A-4D schematically illustrate edge rings for having an upper energy receiving surface according to embodiments of the present invention.

FIG. 4A shows an edge ring 410 having a fin 412 extending from an upper surface 413 of a ring shaped body 411. The edge ring 410 is configured for supporting a substrate 402 while being heated by a radiant energy source 403 disposed above. The edge ring 410 includes a lip 414 for supporting the substrate 402. In one embodiment, a plurality of pads 415 is raised from the lip 414 for contacting the substrate 402.

Figure 4B:
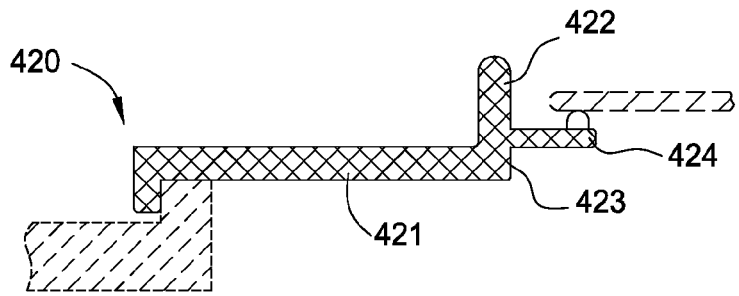

FIG. 4B shows an edge ring 420 having an upwardly extending fin 422 disposed near an inner edge 423 of a ring shaped body 421. A lip 424 extends from the fin 422.

Figure 4C:
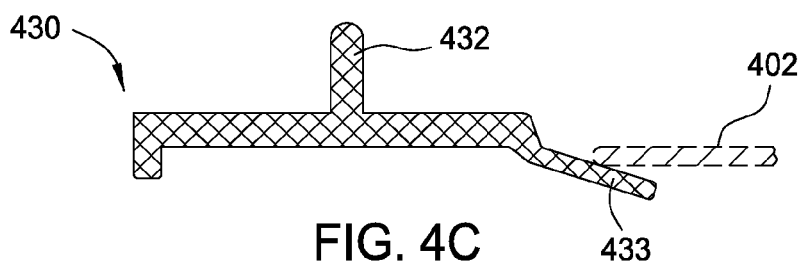

FIG. 4C shows an edge ring 430 having an upwardly extending fin 432 and a tilted lip 433.

Figure 4D:
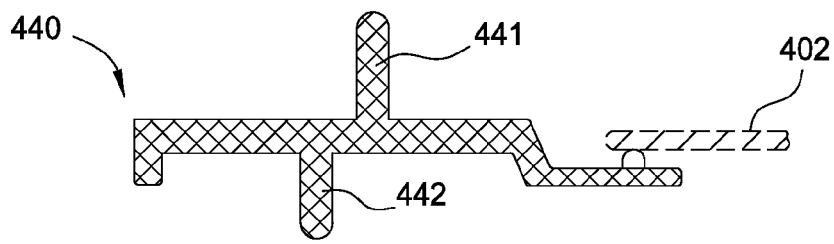

FIG. 4D shows an edge ring 440 having an upper fin 441 and a lower fin 442. The edge ring 440 is suitable when radiant sources are positioned both above and below the substrate 402 and the edge ring 440.

Figure 5:
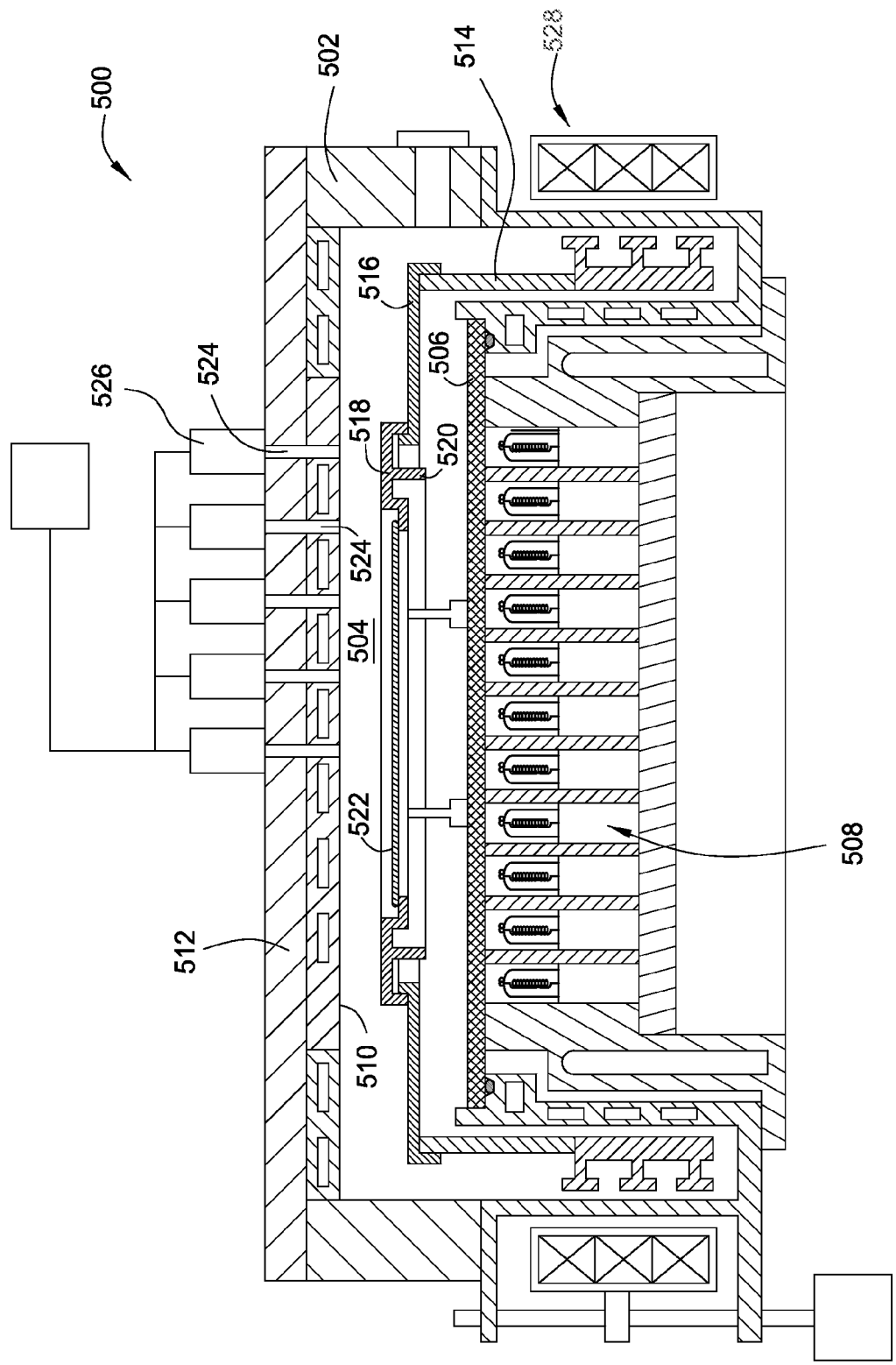
FIG. 5 is a schematic sectional view of a processing chamber according to one embodiment of the present invention.

FIG. 5 is a schematic sectional view of a processing chamber 500 according to one embodiment of the present invention. The processing chamber 500 includes a chamber body 502 defining a processing volume 504. A window 506 is formed on a bottom side of the chamber body 502. The window 506 may be formed form quartz. A radiant energy source 508 is disposed below the window 506. The radiant energy source 508 is configured to direct radiant energy towards the processing volume 504. In one embodiment, the radiant energy source 508 includes a plurality of lamps. A reflection plate 510 is disposed on an upper wall 512 of the chamber body 502 inside the processing volume 504. A plurality of sensors 526 may be disposed over the upper wall 512 to detect temperatures in the processing volume 504 through sensor ports 524 formed in the reflection plate 510 and the upper wall 512.

A raiser assembly 528 is configured to vertically move and rotate a rotor 514 disposed in the processing volume 504. A supporting ring 516 is disposed on the rotor 514.

An edge ring 518 is supported by the supporting ring 516. A substrate 522 is supported by the edge ring 518 during processing. The edge ring 518 and the substrate 522 are positioned above the radiant energy source 508 so that the radiant energy source 508 can heat both the substrate 522 and the edge ring 518. The edge ring 518 may be any edge rings according to embodiments of the present invention. In one embodiment, the edge ring 518 includes a surface area increasing structure 520 facing the radiant energy source 508.

During processing, the radiant energy source 508 is configured to rapidly heat the substrate 522 positioned on the edge ring 518, while the edge ring 518 heats an edge region of the substrate 522 by convection through direct contact. Edge rings according to embodiments of the present invention improve temperature uniformity across the substrate 522, particularly along the edge regions shadowed by the edge ring.

More detailed description of a thermal processing chamber may be found in United States Patent Application Publication 2009/0298300, which is herein incorporated by reference.

Figure 6:
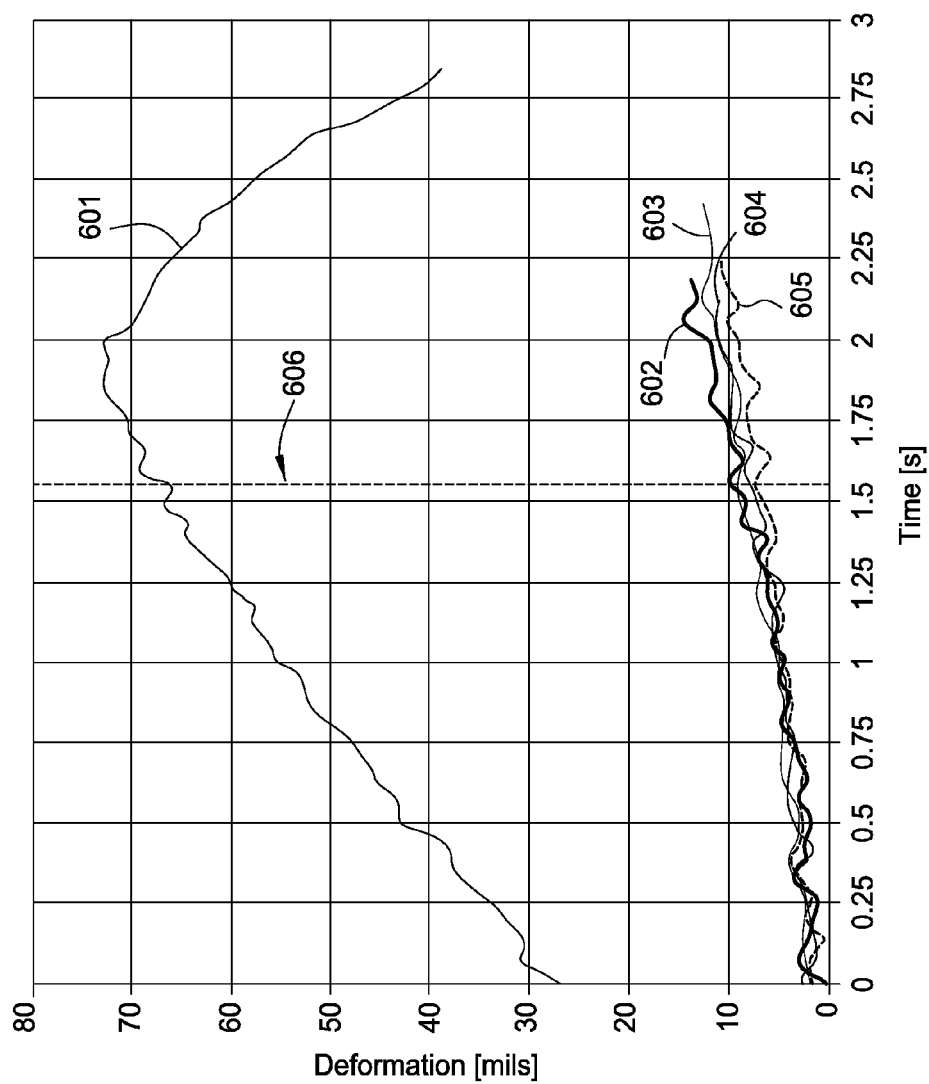
FIG. 6 includes plots showing performance comparison between traditional edge ring and edge rings according to embodiments of the present invention.

Experiments have shown the embodiments of the present invention improve greatly compared to traditional edge rings. FIG. 6 includes plots showing comparison between traditional edge ring and edge rings according to embodiments of the present invention in term of edge ring deformation.

Figure 1A:
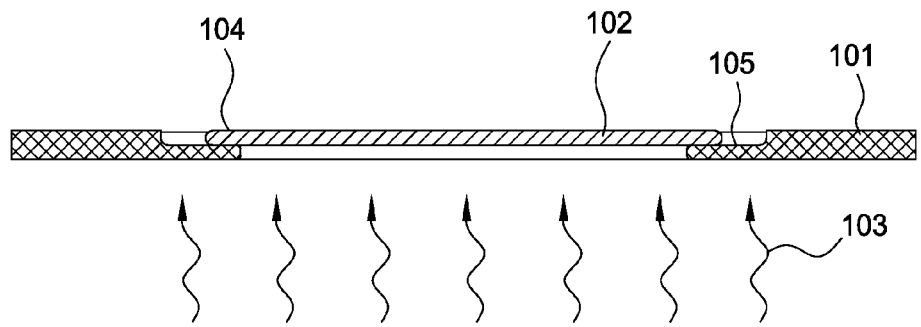
FIG. 1A is a schematic sectional view of a traditional edge ring.
Figure 1B:
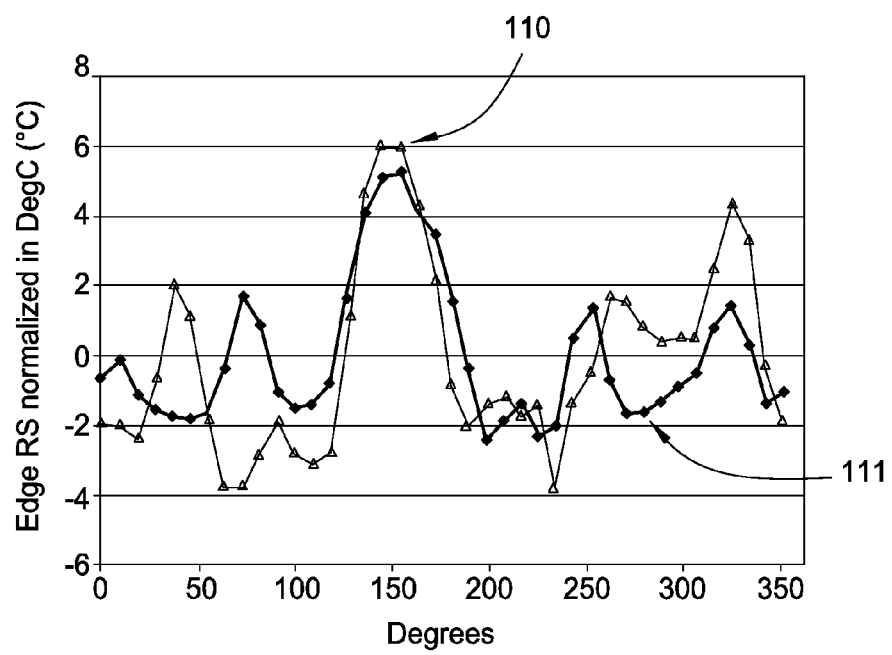
FIG. 1B illustrates temperature variation on a substrate during heating when supported by a traditional edge ring.

Curve 601 shows deformation of a traditional edge ring as shown in FIG. 1A while supporting a substrate being heated to 1090 degrees C.

Curve 602 shows deformation of the edge ring shown in FIG. 2A while supporting a substrate being heated to 1090 degrees C.

Curve 603 shows deformation of the edge ring shown in FIG. 3A while supporting a substrate being heated to 1090 degrees C.

Curve 604 and curve 605 show deformation of the edge ring shown in FIG. 3C while supporting substrates being heated to 1090 degrees C.

FIG. 6 illustrates that edge rings according to embodiments of the present invention reduce edge ring deformation by about 80%.

Temperatures of the substrate being heated are also measured for the processes reflected in FIG. 6.

For the traditional edge ring shown in FIG. 1A, the typical standard deviation of the temperature over the entire substrate is 16.22° C. while the substrate is heated to a target temperature of 1090° C.

For the edge ring shown in FIG. 2A, the typical standard deviation of the temperature over the entire substrate is 5.57° C. while the substrate is heated to a target temperature of 1090° C.

For the edge ring shown in FIG. 3A, the typical standard deviation of the temperature over the entire substrate is 3.60° C. while the substrate is heated to a target temperature of 1090° C.

For the edge ring shown in FIG. 3C, the typical standard deviation of the temperature over the entire substrate is 4.93° C. while the substrate is heated to a target temperature of 1090° C.

Therefore, embodiments of the present invention greatly increase temperature uniformity during a thermal process.

Figure 7A:
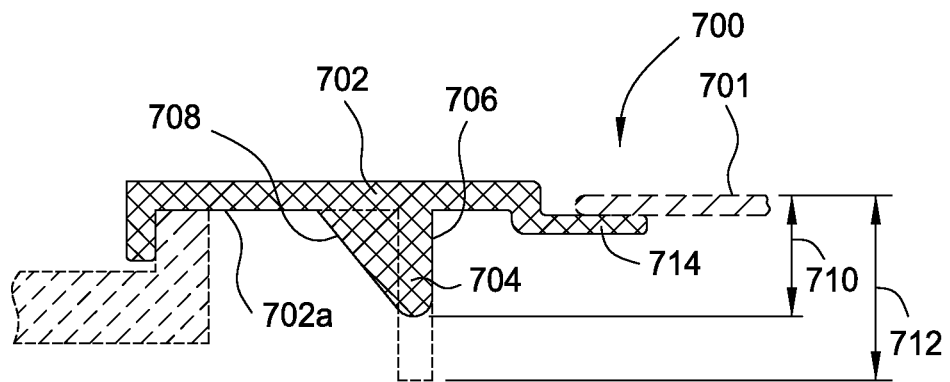
FIGS. 7A-7C schematically illustrate edge rings according embodiments of the present invention.
Figure 7B:
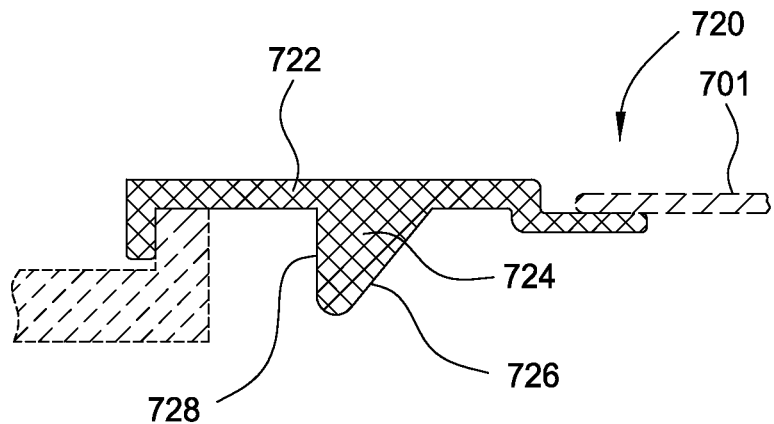
Figure 7C:
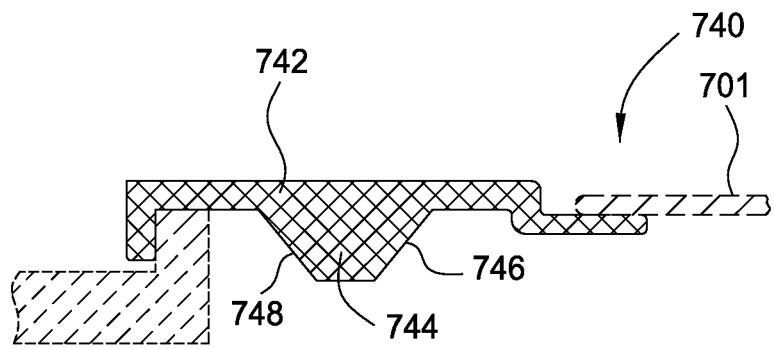

FIGS. 7A-7C are partial sectional views of edge rings according to embodiments of the present invention. The edge rings shown in FIGS. 7A-7C are similar to the edge ring 200 of FIGS. 2A-2E except having a surface increasing structure with one or more sloped surfaces.

FIG. 7A is a partial sectional view of an edge ring 700 according to one embodiment of the present invention. The edge ring 700 includes a substantially planar ring shaped body 702. The ring shaped body 702 has a lip 714 extending radially inward for supporting a substrate 701 thereon. A surface increasing structure, fin 704, extends from a lower surface 702a of the planar ring shaped body 702. The fin 704 reduces a radial temperature gradient in the edge ring 700 during heating by increasing the ratio of exposed surface area and mass in the edge ring 700. The fin 704 also increases stiffness of the edge ring 700. As shown in FIG. 7A, the fin 704 has an inner side 706 substantially perpendicular to the planar ring shaped body 702 and an outer side 708 that is sloped relative to the planar ring shaped body 702.

Compared to fins with two vertical sides, such as the fin 236 of edge ring 200, the sloped side 708 allows the similar effect with reduced total height. As shown in FIG. 7A, a total height 710 with the sloped fin 704 is shorter than a total height 712 with a vertical fin to achieve the same mass and the same stiffness. The reduced height can reduce the amount of raw material needed to manufacture the edge ring, therefore, reducing cost. For example, the edge rings are typically machined from an ingot segment. By reducing the total height of the edge ring, the length of the ingot segment also reduces, thus, reduce the amount of raw material needed. Additionally, fins with sloped side can be easier to manufacture than fins with straight sides, thus, further reducing costs.

FIG. 7B is a partial sectional view of an edge ring 720 according to another embodiment of the present invention. The edge ring 720 is similar to the edge ring 700 except that the edge ring 720 has a fin 724 with a sloped inner side 726 and a vertical outer side 728 extending from a planar ring shaped body 722.

FIG. 7C is a partial sectional view of an edge ring 740 according to another embodiment of the present invention. The edge ring 740 is similar to the edge ring 700 except that the edge ring 740 has a fin 744 with a sloped inner side 746 and a sloped outer side 748 extending from a planar ring shaped body 742.

It should be noted that one or more sloped side may be combined with any of the surface area increasing fins 236, 313, 323, 345, 351, 361, 362, 375, 412, 422, 432, 441 described above.

Even though circular edge rings are described above, embodiments of the present invention may be applied to edge rings of other shapes, such as squared, rectangular, oval, etc. for processing substrates of different shapes.

Even though a thermal process and thermal processing chamber are described above, embodiments of the present invention may be used to any process and in any process chamber where a supporting structure or a substrate is exposed to a radiant energy.

While the foregoing is directed to embodiments of the present invention, other and further embodiments of the invention may be devised without departing from the basic scope thereof, and the scope thereof is determined by the claims that follow.

What is claimed is:

1. An edge ring for supporting a substrate in a processing chamber, comprising:
    a ring shaped body having an inner edge, an outer edge, an upper side and a lower side, wherein the inner edge and outer edge are concentric about a central axis;
    a lip extending radially inward from the inner edge of the ring shaped body, wherein an upper surface of the lip is substantially planar and substantially parallel to a major plane that is perpendicular to the central axis; and
    one or more surface area increasing structures extending from at least one of the upper side or lower side of the ring shaped body, wherein the one or more surface area increasing structures has at least one sloped side relative to the ring shaped body.

2. The edge ring of claim 1, wherein the one or more surface area increasing structures comprises a fin extending from the lower side of the ring shaped body, and the fin has a sloped side.

3. The edge ring of claim 2, wherein the fin forms a circular wall concentric to the inner edge and the outer edge, and the fin is positioned between the inner edge and the outer edge.

4. The edge ring of claim 3, wherein the upper surface of the lip is below an upper surface of the ring shaped body so that the lip and body form a recess for holding the substrate.

5. The edge ring of claim 4, wherein the fin is disposed at the inner edge of the ring shaped body, and the lip extends from the fin.

6. The edge ring of claim 1, further comprising a positioner extending from the ring shaped body.

7. The edge ring of claim 6, wherein the positioner is near the outer edge and the one or more surface area increasing structures is positioned between the inner edge and the outer edge.

8. The edge ring of claim 7, wherein the one or more surface area increasing structures extends vertically from the lower side.

9. A substrate support, comprising:
    a body forming a closed loop about a central axis, wherein the body is equal in radial width around the closed loop;
    a lip extending inward from the body, wherein the lip has a substantially planar upper surface that is substantially parallel to a major plane, wherein the major plane is perpendicular to the central axis, and configured to receive a substrate around an outer edge of the substrate, and the body surrounds the substrate when the substrate is disposed on the lip;

one or more surface area increasing structures extending from an upper surface or a lower surface of the body, wherein the one or more surface increasing structures has at least one sloped side relative to the body; and a positioner extending from the body.

10. The substrate support of claim 9, wherein the body is circular.

11. The substrate support of claim 10, wherein the one or more surface area increasing structures comprises a fin formed on at least one of the upper side or lower side of the body.

12. The substrate support of claim 11, wherein the fin forms a circular wall concentric to an inner edge and an outer edge of the body.

13. The substrate support of claim 12, wherein the fin is disposed at the inner edge of the body, and the lip extends from the fin.

14. The substrate support of claim 9, wherein the positioner is near the outer edge and the one or more surface area increasing structures is positioned between the inner edge and the outer edge.

15. A chamber for processing a substrate, comprising:
a chamber body defining a processing volume, where the chamber body has a window formed therethrough;
a substrate support base disposed in the processing volume;
an energy source disposed outside the window to direct radiant energy towards the processing volume through the window; and
an edge ring disposed on the substrate support base for supporting substrate thereon, wherein the one or more surface area increasing structure of the edge ring faces the energy source, and the edge ring comprises:
a ring shaped body having an inner edge, an outer edge, an upper side and a lower side, wherein the inner edge and outer edge are concentric about a central axis;
a lip extending radially inward from the inner edge of the ring shaped body, wherein an upper surface of the lip is substantially planar and substantially parallel to a major plane that is perpendicular to the central axis; and
one or more surface area increasing structures extending from at least one of the upper side or lower side of the ring shaped body, wherein the one or more surface area increasing structures has at least one sloped side relative to the ring shaped body.

16. The chamber of claim 15, wherein the one or more surface area increasing structures comprises a fin extending from the lower side of the ring shaped body, and the fin has a sloped side.

17. The chamber of claim 15, wherein the edge ring further comprises a positioner extending from the ring shaped body.

18. The chamber of claim 17, wherein the positioner is near the outer edge and the one or more surface area increasing structures is positioned between the inner edge and the outer edge.

* * * * *